(12) United States Patent
Chen et al.

(10) Patent No.: US 8,132,503 B2
(45) Date of Patent: Mar. 13, 2012

(54) METHOD AND APPARATUS FOR PLANARIZING GAP-FILLING MATERIAL

(75) Inventors: Kuei-Shun Chen, Hsinchu (TW); Chin-Hsiang Lin, Hsinchu (TW); T. H. Lin, San-Chung (TW); Chia-Hsiang Lin, Hsinchu (JP)

(73) Assignee: Taiwan Semicondutor Manufacturing Co., Ltd., Hsin-Chu (TW)

( * ) Notice: Subject to any disclaimer, the term of this patent is extended or adjusted under 35 U.S.C. 154(b) by 83 days.

(21) Appl. No.: 11/927,779

(22) Filed: Oct. 30, 2007

(65) Prior Publication Data

US 2008/0060534 A1  Mar. 13, 2008

Related U.S. Application Data

(62) Division of application No. 11/085,295, filed on Mar. 21, 2005, now abandoned.

(51) Int. Cl.
*B30B 9/28* (2006.01)
(52) U.S. Cl. ............... 100/238; 100/92; 100/218
(58) Field of Classification Search ............ 100/48, 100/215, 238, 92, 315, 320, 321, 326, 218; 438/626, 631, 645, 778
See application file for complete search history.

(56) References Cited

U.S. PATENT DOCUMENTS

| | | | |
|---|---|---|---|
| 5,679,610 A | 10/1997 | Matsuda et al. | |
| 6,516,815 B1 | 2/2003 | Stevens et al. | |
| 6,589,881 B2 | 7/2003 | Huang et al. | |
| 6,680,252 B2 | 1/2004 | Chen et al. | |
| 6,969,829 B2 * | 11/2005 | Tsuruno et al. | 219/390 |
| 2001/0029156 A1 * | 10/2001 | Miyashita et al. | 451/56 |
| 2002/0164875 A1 | 11/2002 | Leong | |
| 2003/0045207 A1 * | 3/2003 | Taylor | 451/6 |
| 2004/0029363 A1 | 2/2004 | Nakagawa et al. | |
| 2004/0235298 A1 * | 11/2004 | Inoue et al. | 438/687 |
| 2005/0051266 A1 * | 3/2005 | Chuang et al. | 156/345.12 |
| 2005/0284369 A1 * | 12/2005 | Miya et al. | 118/500 |

FOREIGN PATENT DOCUMENTS

CN   1475029   2/2004

OTHER PUBLICATIONS

CN Office Action mailed May 18, 2007.

* cited by examiner

*Primary Examiner* — Jimmy T Nguyen
(74) *Attorney, Agent, or Firm* — Thomas|Kayden

(57) ABSTRACT

A method an apparatus for fabricating an interconnection structure. A substrate is provided with a dielectric layer thereon. The dielectric layer comprises at least one opening therein. A gap-filling material is applied on the substrate filling the at least one opening. The gap-filling material is planarized using a template to create a substantially planarized surface.

5 Claims, 11 Drawing Sheets

METHOD AND APPARATUS FOR PLANARIZING GAP-FILLING MATERIAL

CROSS REFERENCE TO RELATED APPLICATIONS

This application is a Division of abandoned U.S. patent application Ser. No. 11/085,295, filed Mar. 21, 2005 and entitled "METHOD AND APPARATUS FOR PLANARIZING GAP FILLING".

TECHNICAL FIELD

The present invention relates to methods and apparatus for fabricating an integrated circuit device, and more particularly, to methods and apparatus for planarizing a gap-filling material during fabrication of an integrated circuit device.

BACKGROUND

In semiconductor fabrication, various devices are interconnected by conductive lines and plugs. In general, connection points between conductive wires and integrated circuit devices are referred to as contacts, and connection points between conductive wires are referred to as plugs.

Typically, dual damascene processes can be divided into self-aligned dual damascene (SADD) processes, trench first dual damascene (TFDD) processes and via-first dual damascene (VFDD) processes. In the via-first dual damascene (VFDD), the via lithography is done first on top of the full stack. After via etching and stripping, the trench photo step is done. In some cases, the via opening is filled by a gap-filling material such as organic material. The gap-filling material prevents the entrance of any residual positive photoresist material into the via opening, whereby the via plug resistance and RC de-lay would be increased. The trench photo step, however, is much more challenging, due to the topography variations, since a variety of feature widths and pitches are possible, and achieving a uniform filling material with a smooth flat surface is difficult.

FIG. 1A shows schematic view of a substrate 10 having conductive features/structures comprising isolated 12I, semi-isolated 12II, and dense features 12III. A passivation layer 22, a first dielectric layer 24, an etching stop layer 26, a second dielectric layer 28, and a cap layer 30 are sequentially formed over the substrate 10. A positive photoresist layer (not shown) is formed over the cap layer 30. Photolithographic and etching processes of the positive photoresist layer are conducted to form via openings 40 by removal of a portion of the cap layer 30, the dielectric layer 28, the etching stop layer 26 and the dielectric layer 24. The via openings 40 exposes a portion of the passivation layer 22.

Referring FIG. 1B, a gap-filling material 50 is deposited over the substrate 10, completely filling the via openings 40. After via openings filling, a rough topography is presented resulting in the following trench photo step difficult.

U.S. Pat. No. 6,589,881 (Huang et. al.), the entirety of which is hereby incorporated by reference, discloses a gap-filling material deposited over a substrate, completely filling the via opening. A back-etching operation is conducted to remove excess gap-filling material outside the via opening. However, back-etching operation can induce rough topography from dense to isolated features over 1500 .ANG., resulting in non-linear metal line, via blind, and Cu damage during etch step due to poor gap-filling material protecting in dense areas.

U.S. Pat. No. 6,680,252 (Chen et. al.), the entirety of which is hereby incorporated by reference, discloses a gap-filling material deposited over a substrate and planarized by chemical mechanical polishing (CMP). However, chemical slurry can damage the low-k dielectric layer and the CMP process is time consuming and tedious leading to high production cost and low throughput.

SUMMARY

Methods and an apparatus for planarizing a gap-filling material during fabrication of an integrated circuit are provided. Im-planarization is introduced to planarize a gap-filling material during fabrication.

Embodiments of the invention provide an apparatus for planarizing a gap-filling material on a substrate, comprising a support for the substrate; a template positioned opposite the support with a substantially planar surface; and a controller controlling movements of the template which exert a downward force on the substrate.

Embodiments of the invention provide an apparatus for forming an interconnection structure on a substrate, comprising: a coater to apply a gap-filling material on the substrate; an apparatus for planarizing the gap-filling material on a substrate; an edge-bevel-removal to remove the gap-filling material—at the edge of the substrate; and a spin-dry-rinse cleaner to clean the surface of planarized gap-filling material and back of the substrate.

Embodiments of the invention provide a method for fabricating a damascene interconnection structure, comprising: providing a substrate with a dielectric layer thereon, the dielectric layer having at least one opening therein; disposing a gap-filling material on the substrate filling the opening; and planarizing the gap-filling material to create a substantially planarized surface.

DESCRIPTION OF THE DRAWINGS

Methods and apparatus for planarizing a gap-filling material will become more fully understood from the description given hereinafter and the accompanying drawings which are given by way of illustration only, and thus are not limitative of the present invention, and wherein.

DETAILED DESCRIPTION

Figure 1A:
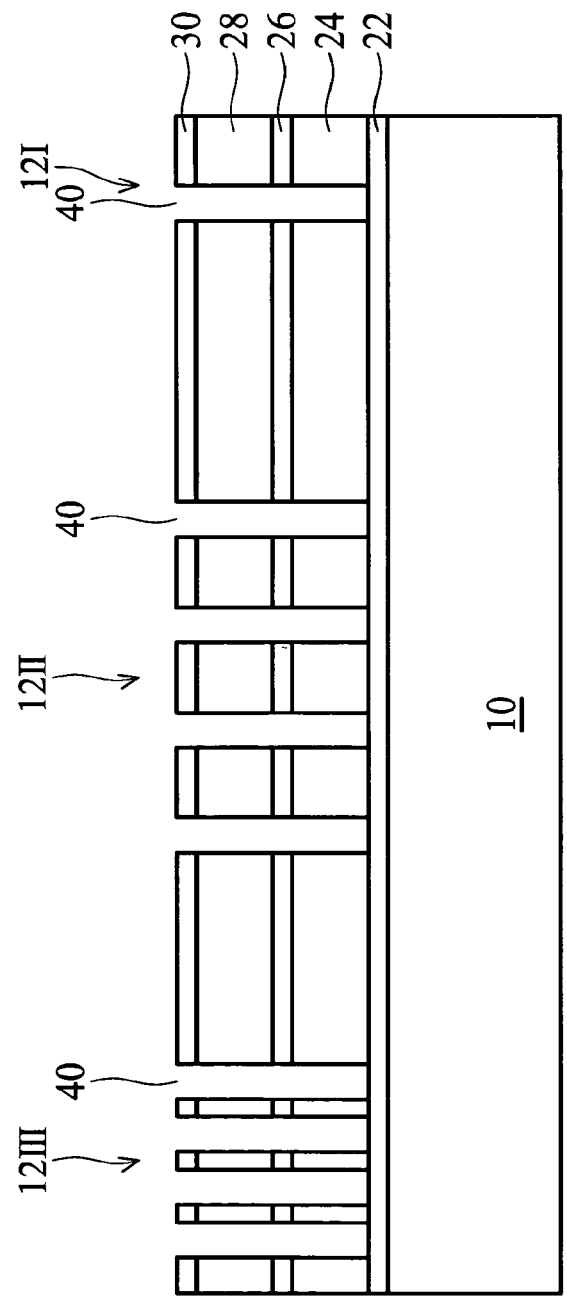
FIGS. 1A and 1B are cross-sections of filling a gap-fill material in a conventional via-first damascene process.
Figure 1B:
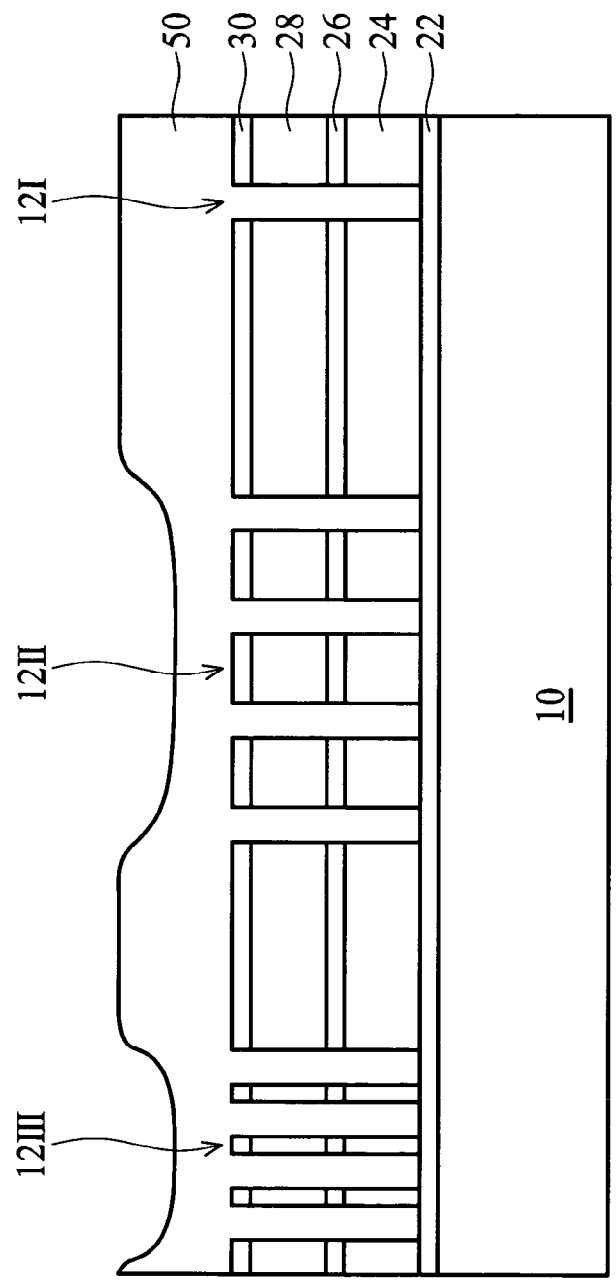

Methods and apparatus for planarizing a gap-filling material are provided. Embodiments of methods of fabricating dual damascene interconnect lines is described in greater detail by referring to the drawings that accompany the invention. It is noted that in the accompanying drawings, like and/or corresponding elements are referred to by like reference numerals.

Referring to 2A, a substrate 100 such single crystalline silicon wafer with a patterned dielectric layer thereon is provided. The substrate 100 is placed on a support 210 which can move upward and downward onto a base 230 by a shaft 220. According to various embodiments of the invention, it is easy for a load robot (not shown) to move in and move out the wafer on the support, but not limited if other methods such as vacuum arm for moving wafers.

Figure 2A:
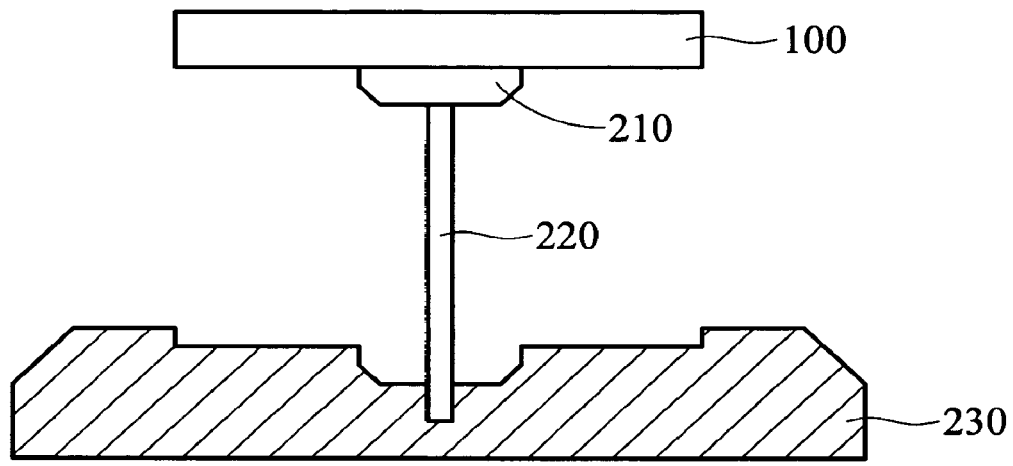
FIG. 2A is a schematic view of substrate disposed on an substrate support apparatus.
Figure 2B:
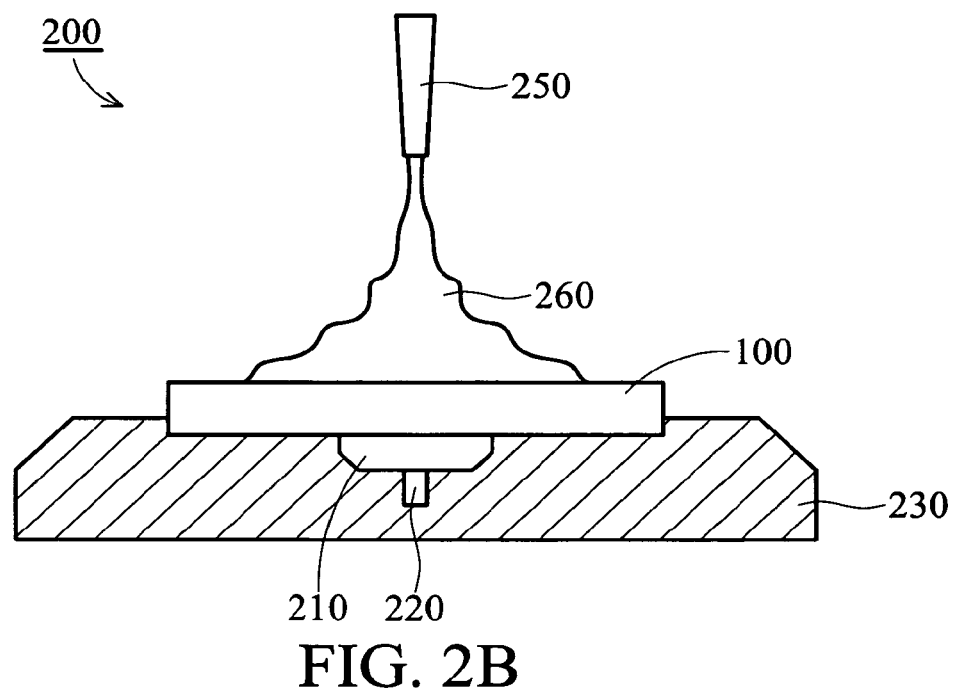
FIG. 2B is a schematic view of a coater and the substrate and the substrate support apparatus of FIG. 2A.
Figure 2C:
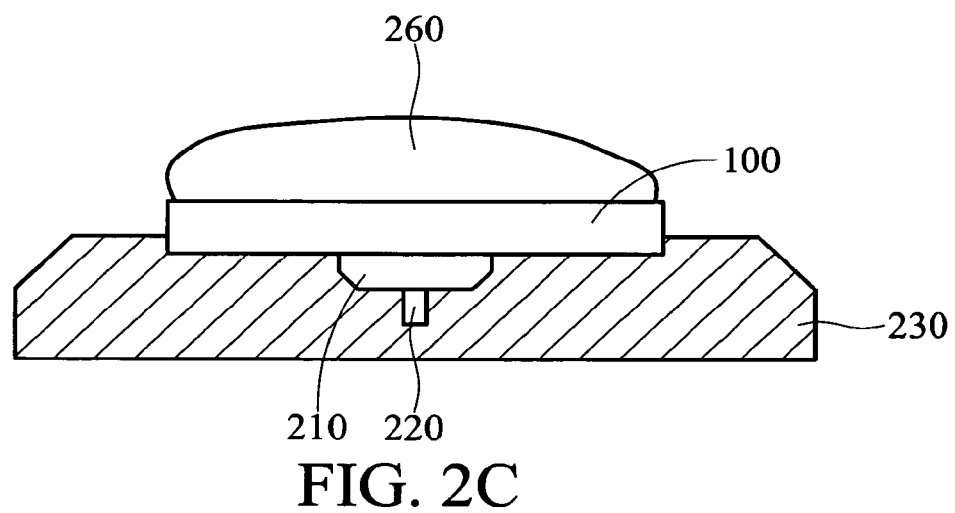
FIG. 2C is a schematic view showing a gap-filling material disposed on the substrate of FIG. 2B.

Referring to FIG. 2B, a coater 200 comprises a dispenser 250 injecting gap-filling material 260 onto the substrate 100. The gap-filling is then cured at a glass transition temperature $T_{.sub.g}$, as shown in FIG. 2C. Different materials have different glass transition temperature. Generally, organic or spin on Si-containing materials are applied for gap filling material. The gap-filling material 260 is applied by plane-template apparatus and coater simultaneously as shown in FIG. 4. Alternatively, the gap-filling material 260 is applied by the plane-template apparatus and coater separately. Since the plug materials 260 become hardened and not easy for planarization, a heating plate 150 is needed for baking step on coater step as shown in FIG. 3.

Alternatively, the gap-filling material 260 can be dispensed and heated at $T_{.sub.g}$ simultaneously.

Figure 3:
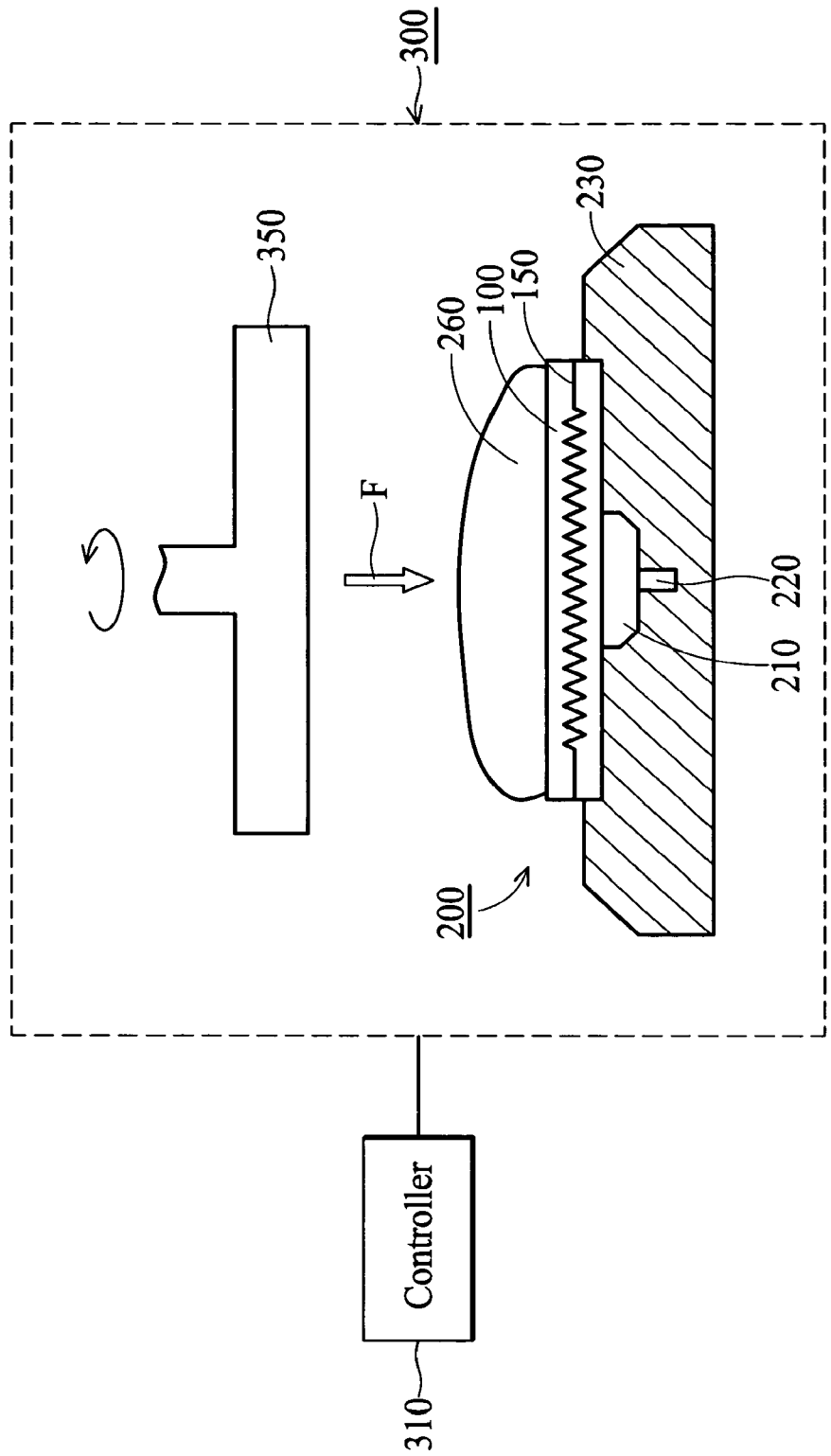
FIG. 3 is schematic view of an exemplary embodiment of a solid plane-template apparatus that planarizes a gap-filling material.
Figure 4:
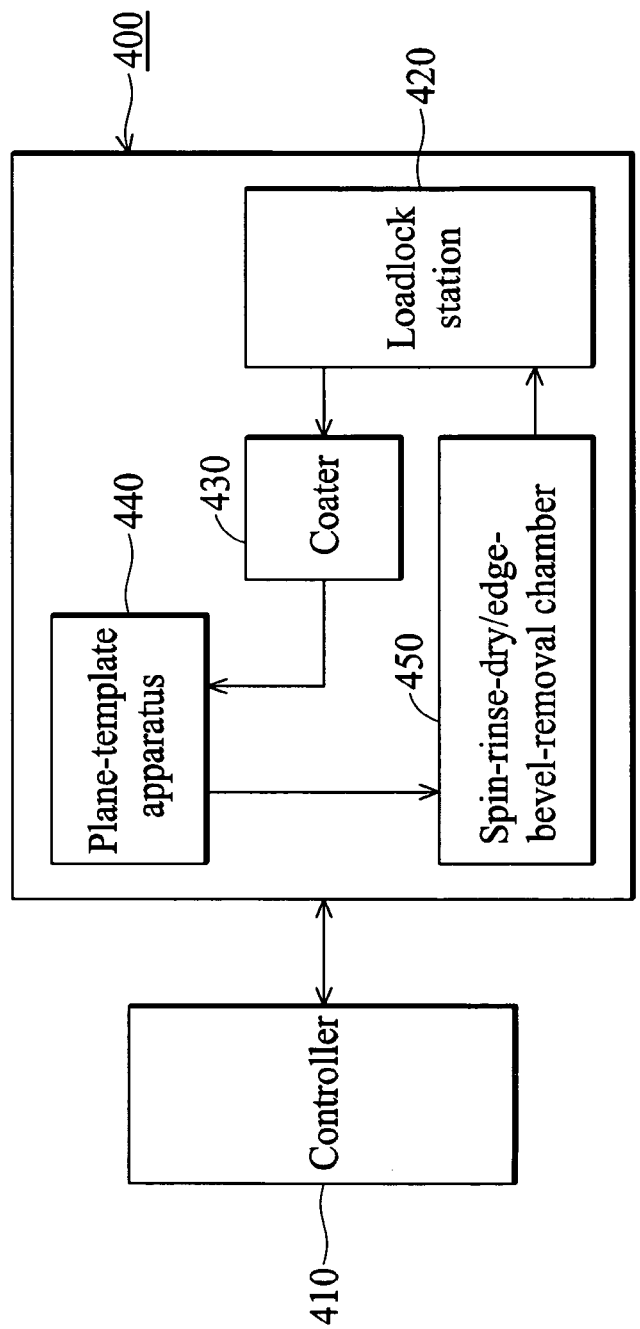
FIG. 4 is schematic view of an exemplary embodiment of an im-planar system.

FIG. 3 is schematic view of an exemplary embodiment of a solid plane-template apparatus 300 for planarizing a gap-filling material 260. A solid plane-template apparatus 300 comprises a template 350 positioned opposing the substrate 100 with a substantially planar surface. The template 350 exerts a downward force F on the gap-filling material 260 providing a substantially planarized surface thereof.

The material of the template comprises Ni, Si, or other materials which have poor adhesion with plug material. In some embodiments, the template 350 has a low adhesion such contact angle>70 degree (i.e., more hydrophobic) to the gap-filling material 260 so that the gap-filling material does not adhere to the template 350 as the template 350 is being withdrawn from the gap-filling material 260, thereby leaving a generally planarized surface. Typically, the contact angle between the template 350 and the gap-filling material 260 is in the range of about less than 70 degree (i.e., more hydrophobic).

A heater 150 is provided to heat the substrate in situ during planarization or post annealing. A controller 310 connects to the solid plane-template apparatus 300 to control linear forward/backward and rotational movements of the template 350.

FIG. 4 is schematic view of an exemplary embodiment of an im-planar system for planarizing a gap-filling material. In FIG. 4, the im-planar system 400 generally includes a load-lock station 420, a coater 430, a solid plane-template apparatus 440, and spin-rinse-dry (SRD) and edge bevel removal (EBR) chambers 450. The im-planar system 400 connects to a controller 410 that typically includes a programmable microprocessor and renders control signal to the im-planar system 400. The loadlock station 420 provides wafers port for storage FOUP or lot. Typically, there are 25 cps/per lot (or FOUP).

Figure 5A:
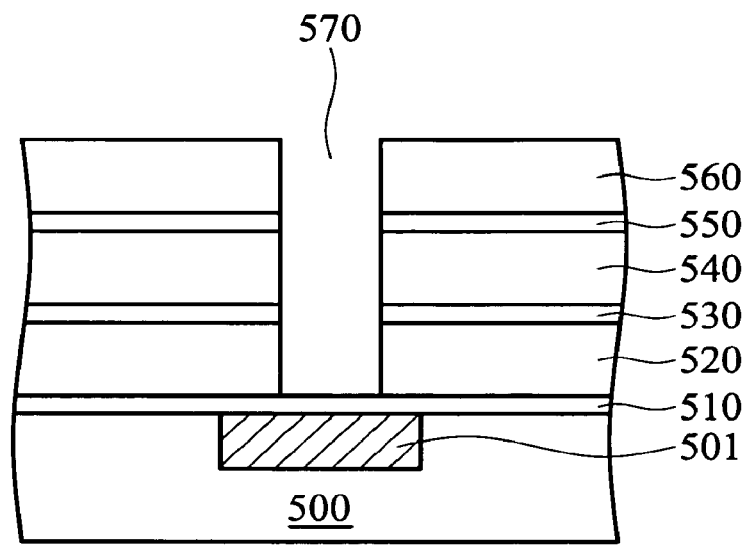
FIGS. 5A-5I are cross sections of an embodiment of dual damascene interconnect lines during various stages of a fabrication process.

FIGS. 5A through 5I are schematic cross-sectionals showing the steps for producing a dual damascene structure according to one embodiment of the invention. Referring to FIG. 5A, a substrate 500 having a conductive line 501 therein (to simplify the figure, devices within the substrate 500 are not drawn) is provided. A passivation layer 510, a first dielectric layer 520, an etching stop layer 530, a second dielectric layer 540 and a cap layer 550 are sequentially formed over the substrate 500.

The passivation layer 510 and the etching stop layer 530 can be a silicon nitride layer formed, for example, by chemical vapor deposition (CVD). The first dielectric layer 520 and the second dielectric layer 540 can be a low dielectric constant (with a dielectric constant less than about 3.9) material including, for example, poly-arylene ether (SiLK), fluorinated poly-arylene ether (FLARE) and hydrogen silsesquioxane (HSQ). The first dielectric layer 520 and the second dielectric layer 540 are formed, for example, by spin-coating or chemical vapor deposition.

The cap layer 550 is made from a material capable of serving as an anti-reflection coating for the exposure of a photoresist layer such as silicon oxynitride (SiON). The cap layer 550 is formed by chemical vapor deposition, for example.

A first photoresist layer 560 is formed over the cap layer 550. The first photoresist layer 560 can be a positive photoresist layer or a negative photoresist layer. The first photoresist layer 560 is patterned to form a via opening pattern. Using the patterned first photoresist layer 560 as a mask, a portion of the cap layer 550, the second dielectric layer 540, the etch stop layer 530, the first dielectric layer 520 are sequentially removed to form a via opening 570 exposing a portion of the etching stop layer 510.

Figure 5B:
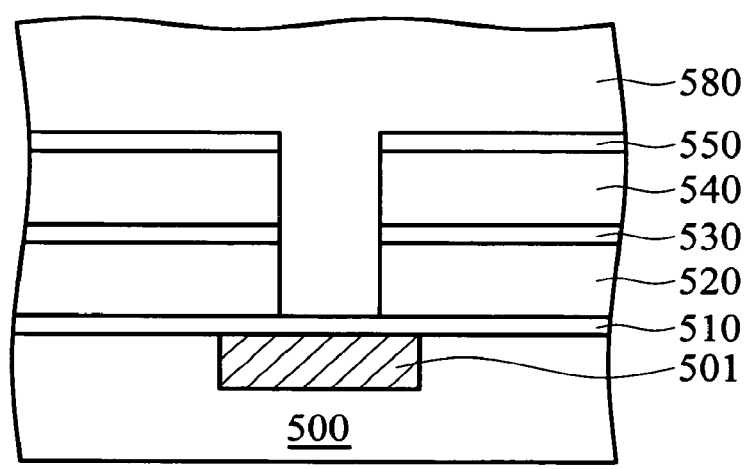

Referring to FIG. 5B, the first photoresist layer 560 is completely removed. A gap-filling material 580 is applied over the cap layer 550, filling the via opening 570.

Figure 5C:
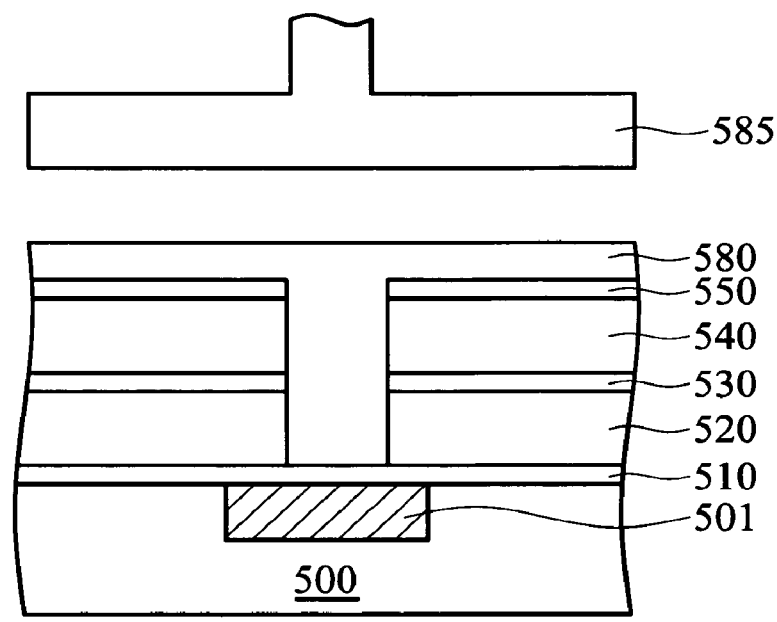

Referring to FIG. 5C, a template 585 is pressed against the gap-filling material 580. A force is applied to the template such that the template 585 planarizes the gap-filling material.

Figure 5D:
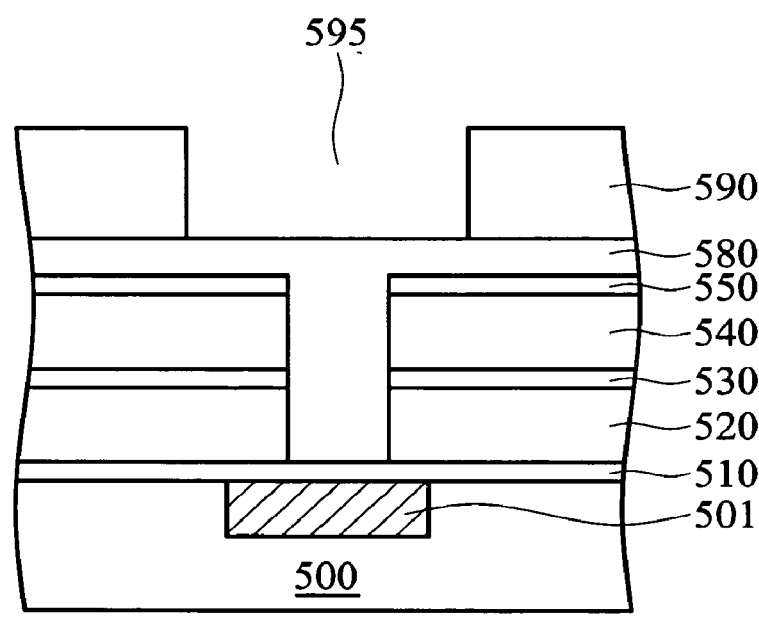

Referring to FIG. 5D, a second photoresist 590 such as negative photoresist is formed and patterned on the planarized gap-filling material 580. The patterned second photoresist comprises a trench 595 pattern therein.

Figure 5E:
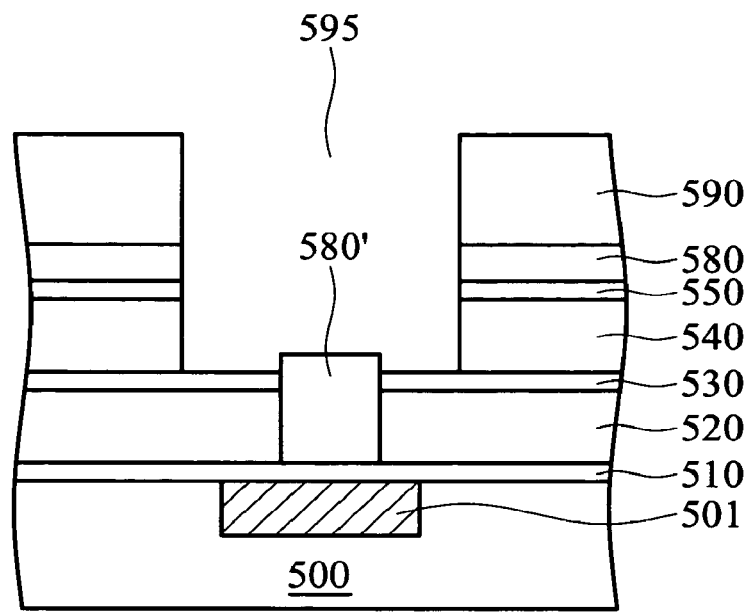

Referring to FIG. 5E, using the second photoresist layer 590 as a mask, a portion of gap-filling material 580 is removed from the trench 595 to expose a portion of the stop etch layer 530. The portion of the gap-filling material 580' which remains fills the via opening 570.

Figure 5F:
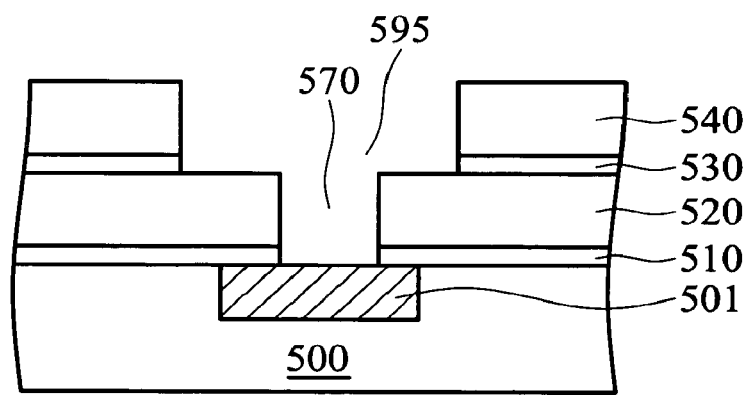

Referring to FIG. 5F, the cap layer 550 and the second photoresist layer 590 are removed along with the remaining gap-filling material 580'. Removing the remaining gap-filling material 580' exposes a portion of the etch stop layer 530 and a portion of the passivation layer 510. The exposed etch stop layer 530 and passivation layer 510 are also removed, for example, by anisotropic etching.

Figure 5G:
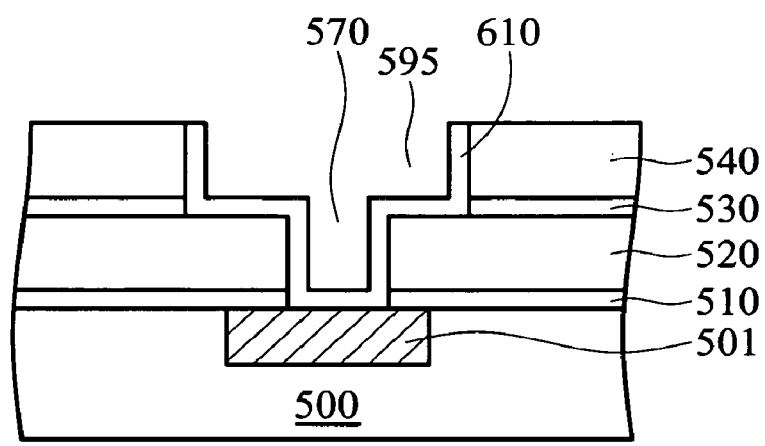

Referring to FIG. 5G, a conformal barrier layer 610 is formed over the exposed portion of the substrate 501. The barrier layer 610 can be a tantalum nitride (TaN), a titanium nitride (TiN) or a titanium silicon nitride (TiSiN) layer, for example. The barrier layer 610 is disposed on the exposed portion of the substrate 501 and on the exposed portions of the passivation layer 510, the first dielectric layer 520, the etch stop layer 530, and the second dielectric layer 540.

Figure 5H:
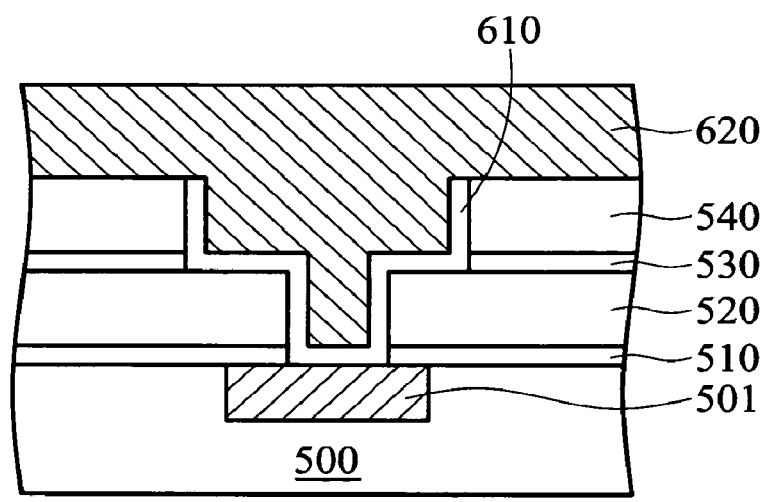

Referring to FIG. 5H, A conductive layer 620 is formed over the barrier layer 610. The conductive layer 620 fills the remainder of the opening 570 and the trench 595. The conductive layer 620 can be a copper layer formed, for example, by physical vapor deposition (PVD), chemical vapor deposition (CVD) or sputtering.

Figure 5I:
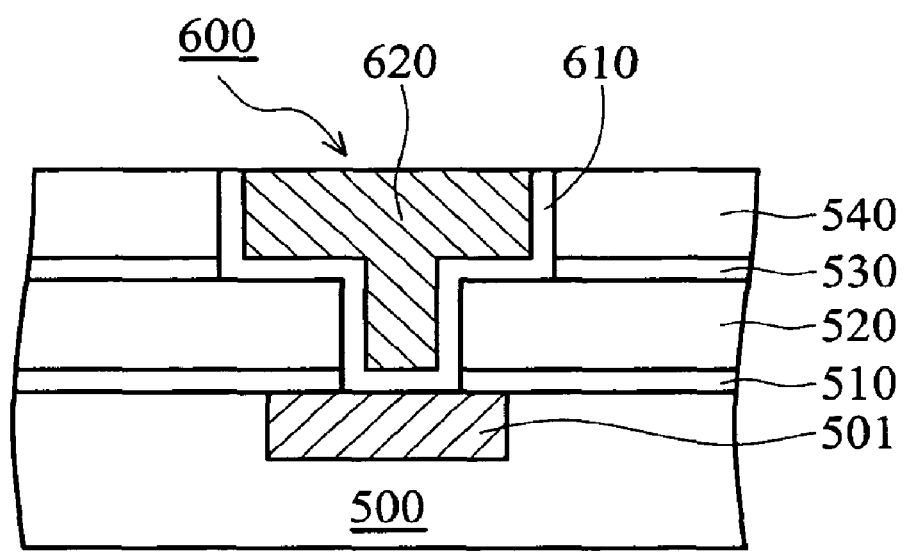

Referring to FIG. 5I, a chemical-mechanical polishing (CMP) operation is conducted to remove the metallic layer 620 and the barrier layer 610 outside the trench exposing the second dielectric layer 540. Thus, a dual damascene structure 600 is formed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A plane-template apparatus for planarizing a gap-filling material on a substrate, comprising:
    a base;
    a shaft extending through the base;
    a non-rotatable support for the substrate, the support being positioned within the base, the support moveable upward and downward to place the substrate onto the base by the shaft;
    a rotatable template positioned opposite the support, the template having a substantially planar surface;
    a heater positioned under the gap-filling material to heat the substrate; and
    a controller controlling relative movements of the template which exerts a downward force on the substrate, such that the gap-filling material has a planarized surface that is attributed to the downward force exerted by the substantially planar surface of the template.

2. The apparatus according to claim 1, wherein the material of the template comprises Ni, or Si.

3. The apparatus according to claim 1, wherein the material of the template comprises a material has a contact angle greater than 70 degree to the gap-filling material.

4. The apparatus according to claim 1, wherein the controller controls rotational movement of the template.

5. An apparatus for forming an interconnection structure on a substrate, comprising:
    a coater to apply a gap-filling material on the substrate;
    an edge-bevel-removal to remove the gap-filling material at the edge of the substrate;
    a spin-dry-rinse cleaner to clean the surface of planarized gap-filling material and back of the substrate; and
    a plane-template apparatus comprising:
        a base;
        a shaft extending through the base;
        a non-rotatable support for the substrate, the support being positioned within the base, the support moveable upward and downward to place the substrate onto the base by the shaft;
        a rotatable template positioned opposite the support, the template having a substantially planar surface;
        a heater positioned under the gap-filling material to heat the substrate; and
        a controller controlling relative movements of the template which exerts a downward force on the substrate, such that the gap-filling material has a planarized surface that is attributed to the downward force by the substantially planar surface of the template.

* * * * *